(12) United States Patent
Song et al.

(10) Patent No.: US 8,970,102 B2
(45) Date of Patent: Mar. 3, 2015

(54) ORGANIC LIGHT EMITTING DEVICE AND FILLER FOR SEALING THE SAME

(75) Inventors: Seung-Yong Song, Yongin (KR); Young-Seo Choi, Yongin (KR); Oh-June Kwon, Yongin (KR); Ji-Hun Ryu, Yongin (KR); Sun-Young Jung, Yongin (KR); Young-Cheol Joo, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 577 days.

(21) Appl. No.: 12/656,419

(22) Filed: Jan. 28, 2010

(65) Prior Publication Data

US 2011/0062846 A1   Mar. 17, 2011

(30) Foreign Application Priority Data

Sep. 14, 2009   (KR) .................. 10-2009-0086706

(51) Int. Cl.
| | | |
|---|---|---|
| *H05B 33/22* | (2006.01) | |
| *H01L 51/52* | (2006.01) | |
| *C08L 83/04* | (2006.01) | |
| *C08G 77/12* | (2006.01) | |
| *C08G 77/20* | (2006.01) | |

(52) U.S. Cl.
CPC ............ *H01L 51/5237* (2013.01); *C08L 83/04* (2013.01); *C08G 77/12* (2013.01); *C08G 77/20* (2013.01)
USPC ......................................... 313/504; 313/509

(58) Field of Classification Search
USPC ............ 313/498–512; 315/169.3; 345/36, 45, 345/76
See application file for complete search history.

(56) References Cited

U.S. PATENT DOCUMENTS

| | | | |
|---|---|---|---|
| 5,082,880 A | 1/1992 | Kitahara et al. | |
| 2002/0198319 A1* | 12/2002 | Kudo et al. | ............... 525/100 |
| 2006/0159937 A1* | 7/2006 | Miyoshi et al. | ............... 428/447 |
| 2009/0029623 A1* | 1/2009 | Son et al. | ................ 445/25 |

FOREIGN PATENT DOCUMENTS

| | | |
|---|---|---|
| JP | 09-204981 A | 8/1997 |
| JP | 2005-0129515 A | 5/2005 |
| JP | 2009-009923 A | 1/2009 |
| JP | 2011-016965 A | 1/2011 |
| KR | 10-2004-0004148 A | 1/2004 |
| KR | 10 2007-0072400 A | 7/2007 |
| KR | 10-2008-0087257 A | 10/2008 |
| KR | 10 2008-0087257 A | 10/2008 |
| KR | 10-2009-0019690 A | 2/2009 |

OTHER PUBLICATIONS

Silicon Handbook, Nikkan Kogyo Shimbum Ltd., Aug. 31, 1990, p. 384-p. 387.

* cited by examiner

*Primary Examiner* — Mariceli Santiago
*Assistant Examiner* — Christopher Raabe
(74) *Attorney, Agent, or Firm* — Lee & Morse, P.C.

(57) ABSTRACT

An organic light emitting device display includes a substrate, an organic light emitting diode array on the substrate, an encapsulation substrate on the organic light emitting diode array, and an internal filler between the organic light emitting diode array and the encapsulation substrate, the internal filler including a cross-linked silicone polymer.

9 Claims, 3 Drawing Sheets

ORGANIC LIGHT EMITTING DEVICE AND FILLER FOR SEALING THE SAME

BACKGROUND

1. Field

Example embodiments relate to an organic light emitting device and a filler for sealing the same.

2. Description of the Related Art

An organic light emitting device is a self light emitting display that emits light by electrically exciting an organic compound. The organic light emitting device may be operable at a low voltage and may exhibit high visibility and quick response rate. Since the organic light emitting device is light and thin, it is drawing attention as the next-generation display.

The organic compound of the organic light emitting device, however, may deteriorate when exposed to moisture and/or oxygen. Therefore, the organic light emitting device may include an encapsulating member, e.g., an encapsulation substrate, thereon to provide protection from moisture and/or oxygen. A conventional encapsulation substrate, however, may be easily damaged by external impact or pressure.

SUMMARY

Embodiments are therefore directed to an organic light emitting device and a filler for sealing the same, which substantially overcome one or more of the problems due to the limitations and disadvantages of the related art.

It is therefore a feature of an embodiment to provide a filler composition for sealing an organic light emitting device.

It is another feature of an embodiment to provide an organic light emitting device with a filler composition sealing the device and inhibiting degradation of an organic compound therein.

It is yet another feature of an embodiment to provide an organic light emitting device with a filler composition sealing the device and protecting it from external impact or pressure.

At least one of the above and other features and advantages may be realized by providing an organic light emitting device, including a substrate, an organic light emitting diode array on the substrate, an encapsulation substrate on the organic light emitting diode array, and an internal filler filled between the organic light emitting diode array and the encapsulation substrate and including a cross-linked silicone polymer.

The cross-linked silicone polymer may be obtained by an addition cure reaction of a alkenyl-modified silicone polymer and a hydrogen-modified silicone polymer.

The alkenyl-modified silicone polymer and the hydrogen-modified silicone polymer mixed during the addition cure reaction may be included at a mixing weight ratio of 1 to 9:9 to 1.

The addition cure reaction may be performed at about 80° C. to about 150° C.

The addition cure reaction may be performed in the presence of a metal catalyst.

The alkenyl-modified silicone polymer may be represented by the following Chemical Formula 1.

[Chemical Formula 1]

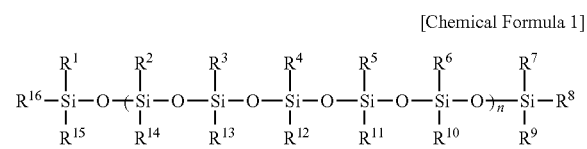

In the above Chemical Formula 1, each of $R^1$ to $R^{16}$ may be independently one of hydrogen, a C1 to C6 alkyl, a C1 to C6 alkoxy, a C6 to C18 aryl, a C5 to C17 heteroaryl, and a C2 to C6 alkenyl, provided that at least one of $R^1$ to $R^{16}$ is a C2 to C6 alkenyl, and n ranges from 1 to 20.

The hydrogen-modified silicone polymer may be represented by the following Chemical Formula 2.

[Chemical Formula 2]

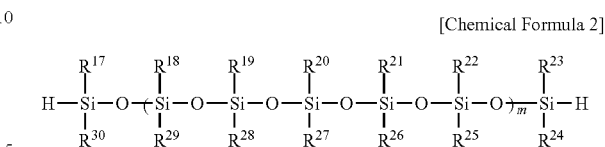

In the above Chemical Formula 2, each of $R^{17}$ to $R^{30}$ is independently one of hydrogen, a C1 to C6 alkyl, a C1 to C6 alkoxy, a C6 to C18 aryl, and a C5 to C17 heteroaryl, and m ranges from 0 to 20.

The organic light emitting device display may further include a sealing member combining the substrate with the encapsulation substrate, and the sealing member may include frit.

The frit may include at least one of $K_2O$, $Fe_2O_3$, $Sb_2O_3$, $ZnO$, $P_2O_5$, $V_2O_5$, $TiO_2$, $Al_2O_3$, $WO_3$, $SnO$, $PbO$, $MgO$, $CaO$, $BaO$, $Li_2O$, $Na_2O$, $B_2O_3$, $TeO_2$, $SiO_2$, $Ru_2O$, $Rb_2O$, $Rh_2O$, $CuO$, and $Bi_2O_3$.

The internal filler may be separated from the sealing member by a distance of about 100 μm to about 300 μm.

The sealing member may be cured by being irradiated with a laser or ultraviolet (UV) ray.

At least one of the above and other features and advantages may also be realized by providing a sealing filler for an organic light emitting device, including a alkenyl-modified silicone polymer and a hydrogen-modified silicone polymer.

The alkenyl-modified silicone polymer and the hydrogen-modified silicone polymer may be included at a mixing weight ratio of 1:9 to 9:1.

The alkenyl-modified silicone polymer may be represented by the following Chemical Formula 1.

[Chemical Formula 1]

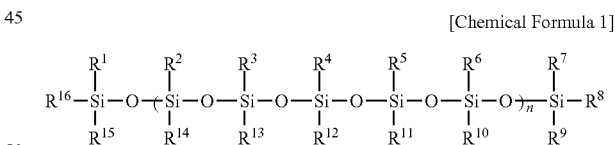

In the above Chemical Formula 1, each of $R^1$ to $R^{16}$ may be independently one of hydrogen, a C1 to C6 alkyl, a C1 to C6 alkoxy, a C6 to C18 aryl, a C5 to C17 heteroaryl, and a C2 to C6 alkenyl, provided that at least one of $R^1$ to $R^{16}$ is a C2 to C6 alkenyl, and n ranges from 1 to 20.

The hydrogen-modified silicone polymer may be represented by the following Chemical Formula 2.

[Chemical Formula 2]

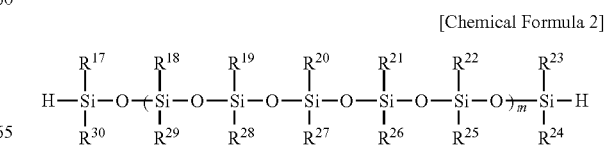

In the above Chemical Formula 2, each of $R^{17}$ to $R^{30}$ is independently one of hydrogen, a C1 to C6 alkyl, a C1 to C6 alkoxy, a C6 to C18 aryl, and a C5 to C17 heteroaryl, and m ranges from 0 to 20.

At least one of the above and other features and advantages may also be realized by providing a method of manufacturing an organic light emitting device display, including forming an organic light emitting diode array on a substrate, forming an encapsulation substrate on the organic light emitting diode array, and forming an internal filler between the organic light emitting diode array and the encapsulation substrate, the internal filler including a cross-linked silicone polymer.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
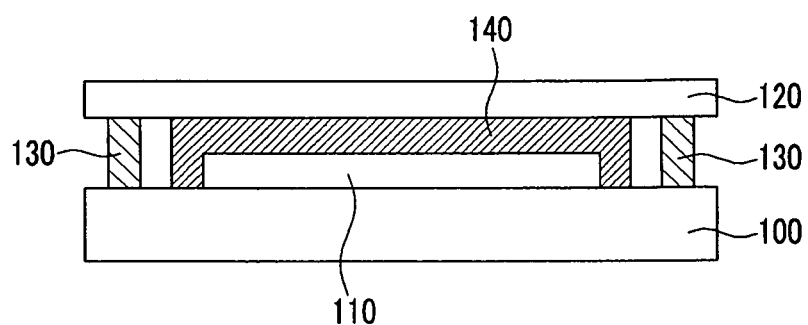
FIG. 1 illustrates a cross-sectional view of an organic light emitting device including an internal filler according to an example embodiment.

Korean Patent Application No. 10-2009-0086706, filed on Sep. 14, 2009, in the Korean Intellectual Property Office, and entitled: "Organic Light Emitting Device and Filler for Sealing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a cross-sectional view of an organic light emitting device according to an embodiment. Referring to FIG. 1, the organic light emitting device, i.e., an organic light emitting diode (OLED) display, may include a substrate 100, an organic light emitting diode array 110 formed on the substrate 100 and including at least one organic light emitting diode, an encapsulation substrate 120, a sealing member 130 for combining, e.g., attaching, the substrate 100 and the encapsulation substrate 120, and an internal filler 140 filling a space between the substrate 100 and the encapsulation substrate 120, e.g., filling a space between the organic light emitting diode array 110 and the encapsulation substrate 120.

The substrate 100 may be formed of any suitable material. For example, the substrate 100 may be formed of glass and/or a transparent plastic material.

The organic light emitting device array 110 may include at least one organic light emitting diode. Each organic light emitting diode may include a first electrode, an emission layer, and a second electrode, e.g., sequentially stacked on the substrate 100. The first electrode may include a plurality of thin film transistors in a lower part, and may be electrically connected to a drain electrode of a thin film transistor. Any one of the first electrode and the second electrode may be an anode, and the other may be a cathode. In the organic light emitting diode, when a predetermined level of voltage is applied to the anode and the cathode, holes implanted in the anode transfer to the emission layer through a hole transport layer, while electrons implanted in the cathode transfer to the emission layer through an electron transport layer. Excitons are generated as the electrons are recombined with the holes in the emission layer, and as the state of the excitons changes from an excited state to a base state, organic materials in the emission layer emit light to realize an image. The color of the emitted light changes according to the organic material in the emission layer of an organic light emitting diode, and lights of diverse grayscales may be realized by using organic materials representing red, green, and blue colors.

The encapsulation substrate 120 may be formed, e.g., of glass, metal, plastic and/or a silicon oxide. The encapsulation substrate 120 may be attached to the substrate 100, such that the organic light emitting device array 110 may be positioned therebetween. The organic light emitting device array 110 may be positioned at a predetermined distance from the encapsulation substrate 120, such that a space may be defined therebetween.

The sealing member 130 may combine the substrate 100 with the encapsulation substrate 120. The sealing member 130 may be formed of diverse materials, e.g., of a material exhibiting adhesion. For example, the sealing member 130 may include frit. The frit may include at least one of $K_2O$, $Fe_2O_3$, $Sb_2O_3$, $ZnO$, $P_2O_5$, $V_2O_5$, $TiO_2$, $Al_2O_3$, $WO_3$, $SnO$, $PbO$, $MgO$, $CaO$, $BaO$, $Li_2O$, $Na_2O$, $B_2O_3$, $TeO_2$, $SiO_2$, $Ru_2O$, $Rb_2O$, $Rh_2O$, $CuO$, $Bi_2O_3$, etc.

The internal filler 140 may cover the organic light emitting device array 110, e.g., the organic light emitting device array 110 may be completely encapsulated between the internal filler 140 and the substrate 100. The internal filler 140 may fill the space between the substrate 100 and the encapsulation substrate 120, e.g., completely fill a space between the organic light emitting device array 110 and the encapsulation substrate 120. The internal filler 140 may be formed of a material able to discharge gas, and it may be a byproduct or a material having a low reactivity with the substrate 100.

The internal filler 140 may exhibit adhesive properties, and it may be formed of a polymer cross-linked after being charged. When the polymer of the filler 140 is cross-linking after being charged, the intensity of the organic light emitting diode display may be improved. A non-limiting example of the internal filler 140 may include a cross-linked silicone polymer.

The silicone polymer of the internal filler 140 may be cross-linked through diverse mechanisms. For example, the silicone polymer may be cross-linked through an addition cure reaction. The addition cure reaction does not produce any byproducts, and since the amount of a metal catalyst used for the reaction is minute, the addition cure-reaction may not cause a sub-reaction in the organic light emitting diode. Also, the metal catalyst may be continuously reused.

It is noted that while the silicone polymer may be cross-linked, e.g., through a radical cure reaction or a condensation cure reaction, the radical reaction may cause a sub-reaction in the organic light emitting diode due to a high reactivity of an initiator, and the condensation cure reaction may produce a large amount of a byproduct after the cross-linkage. Therefore, the cross-linked silicone polymer in the internal filler 140 of the organic light emitting diode display according to an embodiment may be produced through an addition cure reaction.

The silicone polymer in the internal filler 140 may be cross-linked through an addition cure reaction between a alkenyl-modified silicone polymer and a hydrogen-modified silicone polymer. Herein, the alkenyl-modified silicone polymer represents a silicone polymer having at least one alkenyl group, e.g., a vinyl group, among its substituents, and the hydrogen-modified silicone polymer includes a hydrogen substituent at both ends of the silicone polymer.

The alkenyl-modified silicone polymer and the hydrogen-modified silicone polymer mixed during the addition cure reaction may be at a mixing weight ratio of about 1:9 to about 9:1. The specified range of the mixing weight ratio may provide sufficient cross-linking bonds, e.g., a crosslinking degree, thereby imparting adhesion and mechanical properties to the internal filler 140.

The addition cure reaction of the silicone polymer may be performed at a temperature of about 80° C. to about 150° C., e.g., for about an hour. Since the alkenyl-modified silicone polymer and the hydrogen-modified silicone polymer are stable at a room temperature, a heating process may be needed to activate a material, e.g., a temperature of about 80° C. may be required to activate the reactants in the cross linking reaction. When a heat treatment is performed in the above range, e.g., when the addition cure reaction is performed at about 150° C. or lower, activation of the reactants in the cross linking reaction may not affect other components, e.g., another layer, of the organic light emitting diode.

The addition cure reaction may be performed in the presence of a metal catalyst. Non-limiting examples of the metal catalyst may include Pt, Zn, and Sn. Even when a small amount of the metal catalyst is used, the metal catalyst may sufficiently induce the addition cure reaction, and it may be reused continuously.

The alkenyl-modified silicone polymer may include a compound represented by Chemical Formula 1 below.

Chemical Formula 1

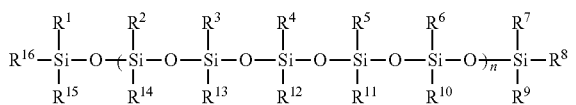

In the above Chemical Formula 1, each of $R^1$ to $R^{16}$ may be independently one of hydrogen, a C1 to C6 alkyl, a C1 to C6 alkoxy, a C6 to C18 aryl, a C5 to C17 heteroaryl, and a C2 to C6 alkenyl (such as vinyl), provided that at least one of the $R^1$ to $R^{16}$ is a C2 to C6 alkenyl, and n ranges from 1 to 20. The alkenyl group in the alkenyl-modified silicone polymer is used for the addition cure reaction for cross-linking.

The hydrogen-modified silicone polymer may include a compound represented by Chemical Formula 2 below.

[Chemical Formula 2]

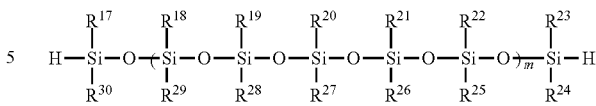

Figure 2:
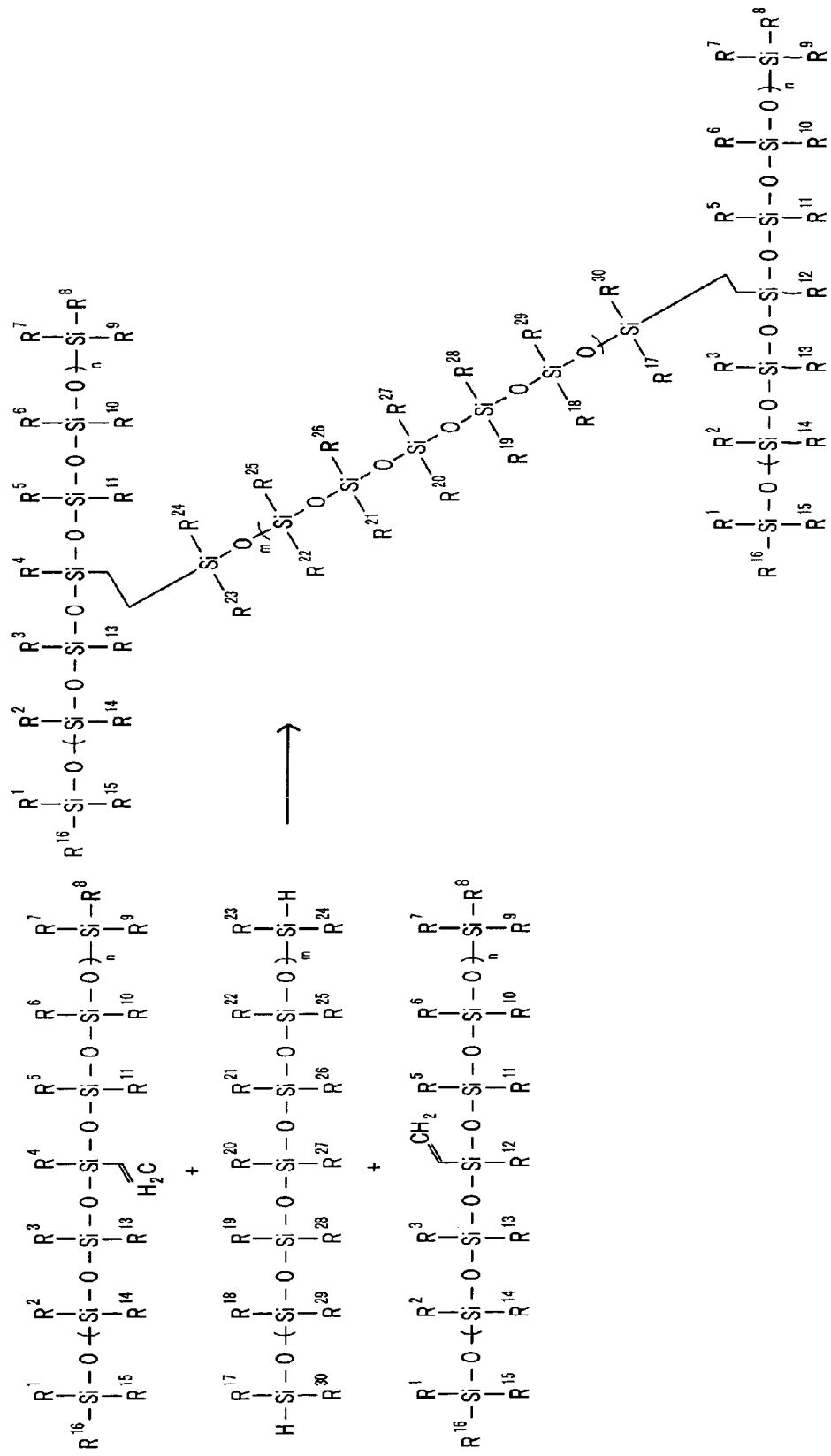
FIG. 2 illustrates a reaction scheme of a cross-linked silicone polymer in an internal filler according to an example embodiment.

In the above Chemical Formula 2, each of $R^{17}$ to $R^{30}$ may be independently one of hydrogen, a C1 to C6 alkyl, a C1 to C6 alkoxy, a C6 to C18 aryl, and a C5 to C17 heteroaryl. Further, m may range from 0 to 20. The hydrogen atoms at both ends of the hydrogen-modified silicone polymer are used for the addition cure reaction for cross-linking. An exemplary reaction scheme of a cross-linked silicone polymer based on an addition cure reaction is illustrated in FIG. 2.

The internal filler 140 may be spaced apart from the sealing member 130. For example, while the internal filler 140 may have a predetermined width on sidewalls of the organic light emitting diode array 110, side surfaces of the internal filler 140 may be at a predetermined distance from the sealing member 130 along a horizontal direction, e.g., at about 100 μm to about 300 μm from the sealing member 130. The predetermined distance between the internal filler 140 and the sealing member 130 may be defined as a distance between a side surface of the internal filler 140, i.e., a surface of the internal filler 140 facing the sealing member 130, and an inner surface of the sealing member 130, i.e., a surface of the sealing member facing the internal filler 140. The space between the internal filler 140 and the sealing member 130 may prevent the internal filler 140 from being deformed by the heat produced when the sealing member 130 is cured.

According to an example embodiment, a sealing filler composition may be prepared to form the internal filler 140. The sealing filler composition may include the alkenyl-modified silicone polymer and the hydrogen-modified silicone polymer at a mixing weight ratio of about 1:9 to about 9:1. Sufficient cross-linking bond may be made when the above range condition is satisfied, and accordingly, the adhesion and mechanical properties of the sealing filler composition may be achieved. Examples of the alkenyl-modified silicone polymer and the hydrogen-modified silicone polymer in the sealing filler composition are represented by the Chemical Formulae 1 and 2 above.

The organic light emitting diode display may be manufactured by preparing the substrate 100, and forming the organic light emitting diode array 110 thereon. The organic light emitting diode array 110 may include at least one organic light emitting diode having a first electrode, an emission layer, and a second electrode on the substrate 100.

Subsequently, the sealing member 130 may be formed on the encapsulation substrate 120. The encapsulation substrate 120 may be arranged so the sealing member 130 thereon may face the organic light emitting diode array 110 on the substrate 100. A position of the sealing member 130 may correspond to an outer brim part of the organic light emitting diode array 110.

A sealing filler composition may be prepared by cross-linking the alkenyl-modified silicone polymer and the hydrogen-modified silicone polymer at a mixing weight ratio of about 1:9 to about 9:1, as discussed above, and may be applied on the encapsulation substrate 120 at a predetermined distance from the sealing member 130, e.g., about 100 μm to about 300 μm. The sealing member 130 and the sealing filler composition may be formed through any suitable method, e.g., deposition, printing, or dripping, on the encapsulation substrate 120, and then the substrate 100 may be combined with the encapsulation substrate 120.

The sealing member 130 may be cured by irradiating the cured organic light emitting diode display with ultraviolet rays. Next, the cured organic light emitting diode display may be put into a heat chamber to cure the sealing filler composition and form the internal filler 140.

Example

A substrate grown of an organic light emitting material was prepared. Aluminum (Al) was used as a cathode on the substrate, and silver (Ag) was used as an anode. A low molecular organic layer was used as an organic emission layer. The low molecular organic layer was formed by stacking a hole injection layer (HIL), a hole transport layer (HTL), an emission layer (EML), an electron transport layer (ETL), and an electron injection layer (EIL) in the form of a composite, and copper phthalocyanine (CuPc), N,N'-di(naphthalen-1-yl)-N, N'-diphenyl-benzidine (NPB), tris-8-hydroxyquinoline aluminum ($Alq_3$).

The low molecular organic layer was formed through a vacuum deposition process. Herein, the HIL, the HTL, the ETL, and the EIL are common layers and they may be commonly applied to red, green, blue pixels. Therefore, the common layers were formed to cover the entire pixels, like an opposed electrode.

Subsequently, an organic light emitting diode array including the formed organic light emitting diode was fabricated. A sealing member, i.e., frit, was formed to correspond to the outer brim part of the fabricated organic light emitting diode array on an encapsulation substrate.

A sealing filler composition was formed on the encapsulation substrate at a distance of about 200 μm from an inner surface of the sealing member. The sealing filler composition included a alkenyl-modified silicone polymer having a molecular weight of about 500 and a hydrogen-modified silicone polymer material having a molecular weight of about 450 at a mixing ratio of about 1:9.

The sealing member and the sealing filler composition were applied to the encapsulation substrate by using a dispenser, and then the substrate was combined with the encapsulation substrate. The sealing member of the combined organic light emitting diode display was cured by being irradiated with ultraviolet rays (UV), and the formed organic light emitting diode display was put into a heat chamber to be cured at about 80° C. for one hour to form an internal filler.

Comparative Example

An organic light emitting diode display was manufactured according to the same method of Example 1, with the exception of forming no internal filler.

Test:

The strengths of the organic light emitting diode displays manufactured according to the Example and Comparative Example were measured. The measurement was performed by using Instron equipment and applying pressure at a speed of about 3 mm/min. A 3-axis bending was used as a tool for assessing equipment strength.

For each of the Example and Comparative Example, 20 organic light emitting diode displays were manufactured and tested. Results are as illustrated in the following Table 1 and FIG. 3.

TABLE 1

| | Three-axis bending | |
|---|---|---|
| | Average | lower 10% value |
| Comparative Example | 42.33 kgf/m$^2$ | 36.18 kgf/m$^2$ |
| Example | 63.91 kgf/m$^2$ | 47.39 kgf/m$^2$ |
| Strength increase ratio | 51.0% | 31.0% |

It can be seen from Table 1 that the organic light emitting diode displays of the Example exhibited an average strength increase of about 51%, as compared with those of the Comparative Example. Even in the lower 10% samples, which were measured to have lower strength, the organic light emitting diode displays of the Example had a strength increase of about 31%, as compared with those of the Comparative Example.

Figure 3:
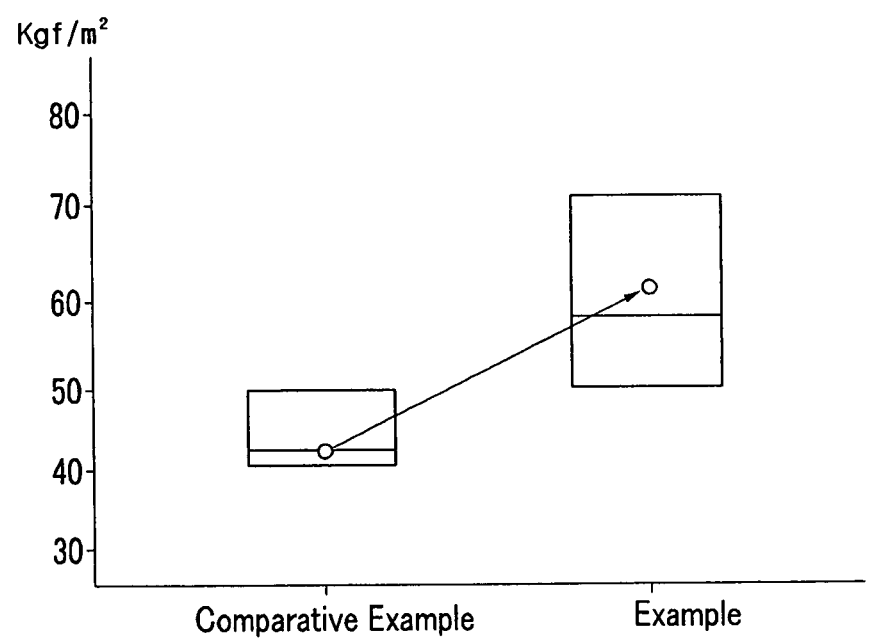
FIG. 3 illustrates an experimental data of strengths of organic light emitting devices according to example embodiments and comparative organic light emitting devices.

FIG. 3 illustrates a graph of the experimental results. In FIG. 3, the x-axis denotes the Comparative Example and Example, while the y-axis denotes the strengths measured by using the 3-axis bending. Further, in FIG. 3, a quadrangle denotes a range of 20 samples for each of the Comparative Example and Example, and a horizontal line inside the quadrangle denotes an average value. The middle spot denotes a median.

According to example embodiments, an organic light emitting device display may include an internal filler between an organic light emitting diode array and an encapsulation substrate, e.g., completely fill a space between the organic light emitting diode array and the encapsulation. The internal filler may include a cross-linked silicone polymer exhibiting sufficient adhesive and mechanical properties to provide support to the encapsulation substrate. For example, the internal filler may increase strength of the organic light emitting device display, so damage to the organic light emitting device display due to external impact or pressure may be minimized, e.g., the internal filler between the organic light emitting diode array and the encapsulation substrate may minimize potential deformation of the encapsulation substrate toward the organic light emitting diode array. Further, the cross-linked silicone polymer in the internal filler may improve intensity of the organic light emitting diode display.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting device display, comprising:
   a substrate;
   an organic light emitting diode array on the substrate;
   an encapsulation substrate on the organic light emitting diode array; and
   an internal filler between the organic light emitting diode array and the encapsulation substrate, the internal filler including a cross-linked silicone polymer that includes an addition cure reaction product of an alkenyl-modified silicone polymer and a hydrogen-modified silicone polymer;
   wherein:
   the alkenyl-modified silicone polymer is represented by Formula 1:

[Formula 1]

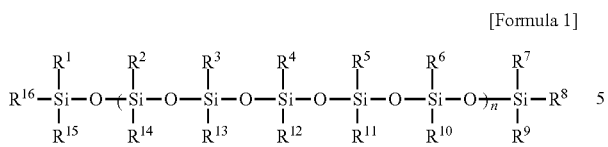

wherein in Formula 1, $R^1$ to $R^{16}$ are each independently selected from the group of hydrogen, a C1 to C6 alkyl, a C1 to C6 alkoxy, a C6 to C18 aryl, a C5 to C17 heteroaryl, and a C2 to C6 alkenyl, provided that at least one of $R^1$ to $R^{16}$ is a C2 to C6 alkenyl, and n ranges from 1 to 20, the hydrogen-modified silicone polymer is represented by Formula 2:

[Formula 2]

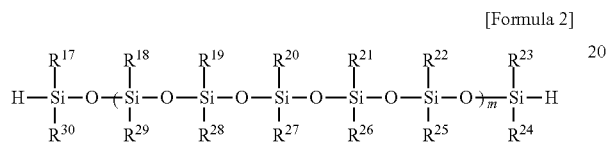

wherein in Formula 2, $R^{17}$ to $R^{30}$ are each independently selected from the group of hydrogen, a C1 to C6 alkyl, a C1 to C6 alkoxy, a C6 to C18 aryl, and a C5 to C17 heteroaryl, and m ranges from 0 to 20, the addition cure reaction product is produced from the alkenyl-modified silicone polymer and the hydrogen-modified silicone polymer at a mixing weight ratio of 1:2 to about 1:9, and wherein the molecular weight of the alkenyl-modified silicone polymer is about 500, and the molecular weight of the hydrogen-modified silicone polymer is about 450.

2. The organic light emitting device display as claimed in claim 1, further comprising a sealing member between the substrate and the encapsulation substrate, the sealing member including frit.

3. The organic light emitting device display as claimed in claim 2, wherein the frit includes at least one of $K_2O$, $Fe_2O_3$, $Sb_2O_3$, ZnO, $P_2O_5$, $V_2O_5$, $TiO_2$, $Al_2O_3$, $WO_3$, SnO, PbO, MgO, CaO, BaO, $Li_2O$, $Na_2O$, $B_2O_3$, $TeO_2$, $SiO_2$, $Ru_2O$, $Rb_2O$, $Rh_2O$, CuO, and $Bi_2O_3$.

4. The organic light emitting device display as claimed in claim 2, wherein the internal filler and the sealing member are spaced apart from each other.

5. The organic light emitting device display as claimed in claim 4, wherein the internal filler and the sealing member are spaced apart from each by about 100 µm to about 300 µm.

6. A method of manufacturing an organic light emitting device display, comprising:
providing an organic light emitting diode array on a substrate;
forming an encapsulation substrate on the organic light emitting diode array; and
forming an internal filler between the organic light emitting diode array and the encapsulation substrate, the internal filler including a cross-linked silicone polymer that includes an addition cure reaction product of an alkenyl-modified silicone polymer and a hydrogen-modified silicone polymer;
wherein:
the alkenyl-modified silicone polymer is represented by Formula 1:

[Formula 2]

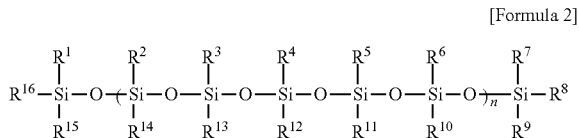

wherein in Formula 1, $R^1$ to $R^{16}$ are each independently selected from the group of hydrogen, a C1 to C6 alkyl, a C1 to C6 alkoxy, a C6 to C18 aryl, a C5 to C17 heteroaryl, and a C2 to C6 alkenyl, provided that at least one of $R^1$ to $R^{16}$ is a C2 to C6 alkenyl, and n ranges from 1 to 20, the hydrogen-modified silicone polymer is represented by Formula 2:

[Formula 2]

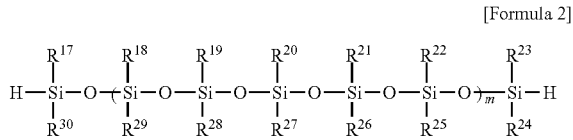

wherein in Formula 2, $R^{17}$ to $R^{30}$ are each independently selected from the group of hydrogen, a C1 to C6 alkyl, a C1 to C6 alkoxy, a C6 to C18 aryl, and a C5 to C17 heteroaryl, and m ranges from 0 to 20, the addition cure reaction product is produced from the alkenyl-modified silicone polymer and the hydrogen-modified silicone polymer at a mixing weight ratio of 1:2 to about 1:9, and wherein the molecular weight of the alkenyl-modified silicone polymer is about 500, and the molecular weight of the hydrogen-modified silicone polymer is about 450.

7. The method as claimed in claim 6, wherein forming the internal filler includes cross-linking the alkenyl-modified silicone polymer and the hydrogen-modified silicone polymer in an addition cure reaction.

8. The method as claimed in claim 7, wherein the addition cure reaction is performed at a temperature of about 80° C. to about 150° C.

9. The method as claimed in claim 7, wherein the addition cure reaction is performed in a presence of a metal catalyst.

* * * * *